(12) United States Patent
Choi et al.

(10) Patent No.: US 12,260,912 B2
(45) Date of Patent: Mar. 25, 2025

(54) SEMICONDUCTOR DEVICE CAPABLE OF CHECKING DETERIORATION OF SELECT TRANSISTOR AND OPERATING METHOD THEREOF

(71) Applicant: SK hynix Inc., Gyeonggi-do (KR)

(72) Inventors: Hyung Jin Choi, Gyeonggi-do (KR); In Gon Yang, Gyeonggi-do (KR); Young Seung Yoo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 216 days.

(21) Appl. No.: 18/299,714

(22) Filed: Apr. 13, 2023

(65) Prior Publication Data
US 2024/0185919 A1   Jun. 6, 2024

(30) Foreign Application Priority Data
Dec. 6, 2022   (KR) .......................... 10-2022-0168576

(51) Int. Cl.
*G11C 16/04* (2006.01)
*G11C 16/10* (2006.01)
*G11C 16/34* (2006.01)

(52) U.S. Cl.
CPC .......... *G11C 16/0483* (2013.01); *G11C 16/10* (2013.01); *G11C 16/3454* (2013.01)

(58) Field of Classification Search
CPC . G11C 16/0483; G11C 16/10; G11C 16/3454; G11C 16/08; G11C 16/3459; G11C 16/3404; G11C 16/30; G11C 16/34; G11C 16/3445

USPC ....................................................... 365/185.17
See application file for complete search history.

(56) References Cited

U.S. PATENT DOCUMENTS

| 8,971,119 B2 | 3/2015 | Avila et al. |
| 2021/0233588 A1* | 7/2021 | Kwon ..................... G11C 16/26 |
| 2023/0038152 A1* | 2/2023 | Lee ......................... G11C 16/14 |

FOREIGN PATENT DOCUMENTS

| KR | 10-2154620 B1 | 9/2020 |
| KR | 10-2022-0064096 A | 5/2022 |

* cited by examiner

*Primary Examiner* — Huan Hoang
(74) *Attorney, Agent, or Firm* — IP & T GROUP LLP

(57) ABSTRACT

A semiconductor device may include a memory cell array including a memory block including a plurality of memory strings connected between a plurality of bit lines and a common source line, a control circuit that generates a page buffer control signal, a voltage control signal, and a drive address signal, a page buffer group including a plurality of page buffers and configured to form each of the plurality of bit lines to a preset voltage level, and generate a threshold voltage variation result on the basis of a change in the voltage level of each of the plurality of bit lines, a voltage generation circuit that generates a threshold verification voltage and a pass voltage, and a line drive circuit that drives a plurality of select lines to a level of the threshold verification voltage, and drives a plurality of word lines to a level of the pass voltage, during the threshold voltage variation verification.

20 Claims, 10 Drawing Sheets

SEMICONDUCTOR DEVICE CAPABLE OF CHECKING DETERIORATION OF SELECT TRANSISTOR AND OPERATING METHOD THEREOF

CROSS-REFERENCE TO RELATED APPLICATION

This application claims priority under 35 U.S.C. § 119 to Korean Patent Application No. 10-2022-0168576 filed on Dec. 6, 2022, which is incorporated herein by reference in its entirety.

BACKGROUND

1. Technical Field

Embodiments of the present disclosure relate to an integrated circuit technology, and more particularly, to a semiconductor device capable of checking a threshold voltage variation of a select transistor and an operating method thereof.

2. Related Art

Recently, with the miniaturization, low power consumption, high performance, multi-functionality, and the like of electronic appliances, semiconductor devices capable of storing information in various electronic appliances such as computers and portable communication devices have been required. The semiconductor devices may be largely classified into volatile memory devices and nonvolatile memory devices. The volatile memory device has an advantage of a high data processing speed, but has a disadvantage in that it needs to continuously receive power in order to retain stored data. The nonvolatile memory device has an advantage in that it does not need to continuously receive power in order to retain stored data, but has a disadvantage of a low data processing speed.

The nonvolatile memory device performs a program operation in order to store data and an erase operation in order to erase stored data. The nonvolatile memory device further performs an operation of verifying whether data has been normally programmed or erased during the program operation or the erase operation.

Accordingly, in order to improve the data processing speed of the nonvolatile memory device, not only research to reduce the time required for the program or erase operation, but also research to reduce the time required for verifying each operation is being conducted.

SUMMARY

In an embodiment of the preset disclosure, a semiconductor device may include: a memory cell array including a memory block including a plurality of memory strings connected between a plurality of bit lines and a common source line; a control circuit that generates a page buffer control signal, a voltage control signal, and a drive address signal on the basis of a command signal and an address signal; a page buffer group including a plurality of page buffers and configured to form each of the plurality of bit lines to a preset voltage level on the basis of the page buffer control signal during threshold voltage variation verification on a plurality of select transistors included in the plurality of memory strings, and generate a threshold voltage variation result by sensing whether a current path is formed in each of the plurality of bit lines; a voltage generation circuit that generates a threshold verification voltage and a pass voltage on the basis of the voltage control signal; and a line drive circuit that drives a plurality of select lines to a level of the threshold verification voltage on the basis of the drive address signal and drives a plurality of word lines to a level of the pass voltage, during the threshold voltage variation verification.

In an embodiment of the preset disclosure, an operating method of a semiconductor device may include: an operation of driving to a level of a threshold verification voltage, a plurality of select lines connected to a plurality of select transistors for which threshold voltage variations are to be checked, and driving a plurality of word lines to a level of a pass voltage; an operation of forming to a preset voltage level, a plurality of bit lines connected to memory strings including the plurality of select transistors; and an operation of determining, when a current path is sensed in any one of the plurality of bit lines, that a threshold voltage of at least one of the plurality of select transistors has changed, the at least one select transistor being connected to the bit line in which the current path is sensed.

In an embodiment of the present disclosure, a semiconductor device may include: a memory block including memory strings each having memory cells and a select transistor coupled to a column line and respective row lines, and a control unit configured to drive a selected row line of the row lines to a threshold voltage level of the select transistors while driving remaining row lines of row lines to a pass voltage level and the column lines to a preset level, the selected row line being coupled to the select transistors, detect, when sensing one or more current paths on the column lines, a threshold voltage variation on the select transistor within a selected memory string of the memory strings, and program the select transistor within the selected memory string.

DETAILED DESCRIPTION

Various embodiments of the present disclosure are directed to a semiconductor device capable of reducing the time required for a threshold voltage variation verification operation on select transistors and an operating method thereof.

By reducing the time required for a threshold voltage variation verification operation on select transistors of a semiconductor device, it is possible to improve the data processing speed of the semiconductor device.

Hereafter, embodiments in accordance with the technical spirit of the present disclosure are described with reference to the accompanying drawings.

Figure 1:
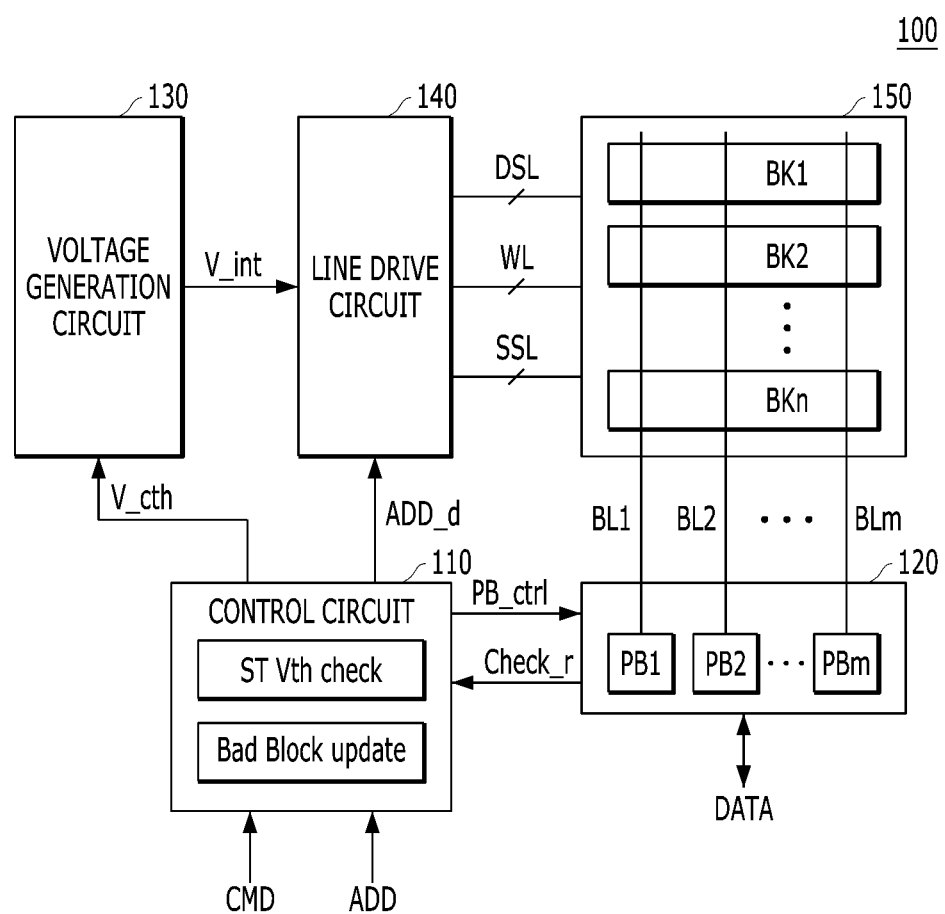
FIG. 1 is a diagram illustrating the configuration of a semiconductor device in accordance with an embodiment of the present disclosure.

FIG. 1 is a diagram illustrating the configuration of a semiconductor device 100 in accordance with an embodiment of the present disclosure.

Referring to FIG. 1, the semiconductor device 100 in accordance with an embodiment may include a control circuit 110, a page buffer group 120, a voltage generation circuit 130, a line drive circuit 140, and a memory cell array 150.

The control circuit 110 may program data in the memory cell array 150 or erase data programmed in the memory cell array 150 by controlling the page buffer group 120, the voltage generation circuit 130, and the line drive circuit 140. The control circuit 110 may also control the page buffer group 120, the voltage generation circuit 130, and the line drive circuit 140 so that a program verification operation is performed after programming data in the memory cell array 150, or an erase verification operation is performed after erasing data programmed in the memory cell array 150. In such a case, the erase verification operation may include not only an operation of verifying a memory cell from which data has been erased, but also an operation of verifying a threshold voltage variation of a first select transistor disposed between a memory cell and a bit line and a second select transistor disposed between the memory cell and a common source line. The first select transistor may include a drain select transistor and the second select transistor may include a source select transistor. The bit line may include a column line.

For example, the control circuit 110 may control the page buffer group 120, the voltage generation circuit 130, and the line drive circuit 140 to verify threshold voltage variations of drain select transistors or source select transistors included in all memory strings connected to respective bit lines BL1, BL2, . . . , BLm (m is a natural number).

More specifically, for example, the control circuit 110 may control the page buffer group 120, the voltage generation circuit 130, and the line drive circuit 140 to check, through one verification operation ST Vth Check, whether threshold voltages of the drain select transistors or the source select transistors included in all memory strings connected to the respective bit lines BL1, BL2, . . . , BLm fall within a normal threshold voltage range. The control circuit 110 may also perform a bad block update operation Bad block update on the basis of the result Check_r of the threshold voltage variation verification operation on the drain select transistors or the source select transistors.

The control circuit 110 may generate a page buffer control signal PB_ctrl on the basis of a command signal CMD and an address signal ADD received from the outside (for example, a host), and provide the page buffer control signal PB_ctrl to the page buffer group 120.

The control circuit 110 may generate a voltage control signal V_ctrl on the basis of the command signal CMD, and provide the voltage control signal V_ctrl to the voltage generation circuit 130.

The control circuit 110 may generate a drive address signal ADD_d on the basis of the command signal CMD and the address signal ADD, and provide the drive address signal ADD_d to the line drive circuit 140.

The page buffer group 120 may include a plurality of page buffers PB1, PB2, . . . , PBm. The plurality of page buffers PB1, PB2, . . . , PBm may be connected to the plurality of bit lines BL1, BL2, . . . , BLm (m is a natural number), respectively. Each of the plurality of page buffers PB1, PB2, . . . , PBm may sense a data value stored in a memory cell through a bit line and output the sensed value as data DATA. During the threshold voltage variation verification on the drain select transistors or the source select transistors, each of the plurality of page buffers PB1, PB2, . . . , PBm may form a corresponding bit line to a preset voltage level on the basis of the page buffer control signal PB_ctrl, sense whether a current path is formed in the bit line, and generate the threshold voltage variation verification result Check_r for the drain select transistors or the source select transistors. Each of the plurality of page buffers PB1, PB2, . . . , PBm may provide the threshold voltage variation verification result Check_r to the control circuit 110. When the current path is sensed in the corresponding bit line, a corresponding page buffer of the plurality of page buffers PB1, PB2, . . . , PBm may generate a signal having a first level, and provide the control circuit 110 with the signal having the first level as the threshold voltage variation verification result Check_r. Furthermore, when the current path is sensed in the corresponding bit line, each of the plurality of page buffers PB1, PB2, . . . , PBm may generate a signal having a second level, and provide the control circuit 110 with the signal having signal second level as the threshold voltage variation verification result Check_r. The first level and the second level may be different levels, and when a signal provided to the control circuit 110 by each of the plurality of page buffers PB1, PB2, . . . , PBm is a digital signal, the first level and the second level may correspond to a high level and a low level, respectively.

The voltage generation circuit 130 may generate internal voltages V_int having various voltage levels on the basis of the voltage control signal V_ctrl, and provide the internal voltages V_int to the line drive circuit 140. For example, during the threshold voltage variation verification on the drain select transistors or the source select transistors, the voltage generation circuit 130 may generate a threshold verification voltage Vth_veri and a pass voltage Vpass on the basis of the voltage control signal V_ctrl, and provide the line drive circuit 140 with the generated voltages as the internal voltages V_int. The threshold verification voltage Vth_veri may have a voltage level corresponding to a minimum allowable level of a normal threshold voltage range of the drain or source select transistor, and the pass voltage Vpass may have a voltage level which is within the normal threshold voltage range of the drain or source select transistor and at which a memory cell may allow a current to pass therethrough regardless of a stored data value. The drain or source select transistors may be turned on when a voltage within the normal threshold voltage range is provided to the gates of the drain or source select transistors.

The line drive circuit 140 may drive drain select lines DSL, word lines WL, and source select lines SSL to voltage levels of the internal voltages V_int on the basis of the drive address signal ADD_d. For example, during the threshold voltage variation verification on the drain select transistors, the line drive circuit 140 may drive the source select lines SSL and the word lines WL to a level of the pass voltage Vpass on the basis of the drive address signal ADD_d, and drive the drain select lines DSL to a level of the threshold verification voltage Vth_veri. During the threshold voltage variation verification on the source select transistors, the line drive circuit 140 may also drive the drain select lines DSL and the word lines WL to the level of the pass voltage Vpass on the basis of the drive address signal ADD_d, and drive the source select lines SSL to the level of the threshold verification voltage Vth_veri. The word lines may include row lines.

The memory cell array 150 may include a plurality of memory blocks BK1, BK2, . . . , BKn (n is a natural number). Each of the plurality of memory blocks BK1, BK2, . . . , BKn may be selected by the word lines WL, and memory strings of a selected memory block may be connected to the plurality of page buffers PB1, PB2, . . . , PBm through the bit lines BL1, BL2, . . . , BLm. Each of the plurality of memory blocks BK1, BK2, . . . , BKn may include a plurality of memory strings in which a plurality of memory cells are connected in series. Each of the plurality of memory strings may include a first select transistor (for example, a drain select transistor), a second select transistor (for example, a source select transistor), and a dummy cell in addition to the plurality of memory cells connected in series. The first select transistor may be configured to be turned on or off by the drain select line DSL, and the second select transistor may be configured to be turned on or turned off by the source select line SSL.

Figure 2A:
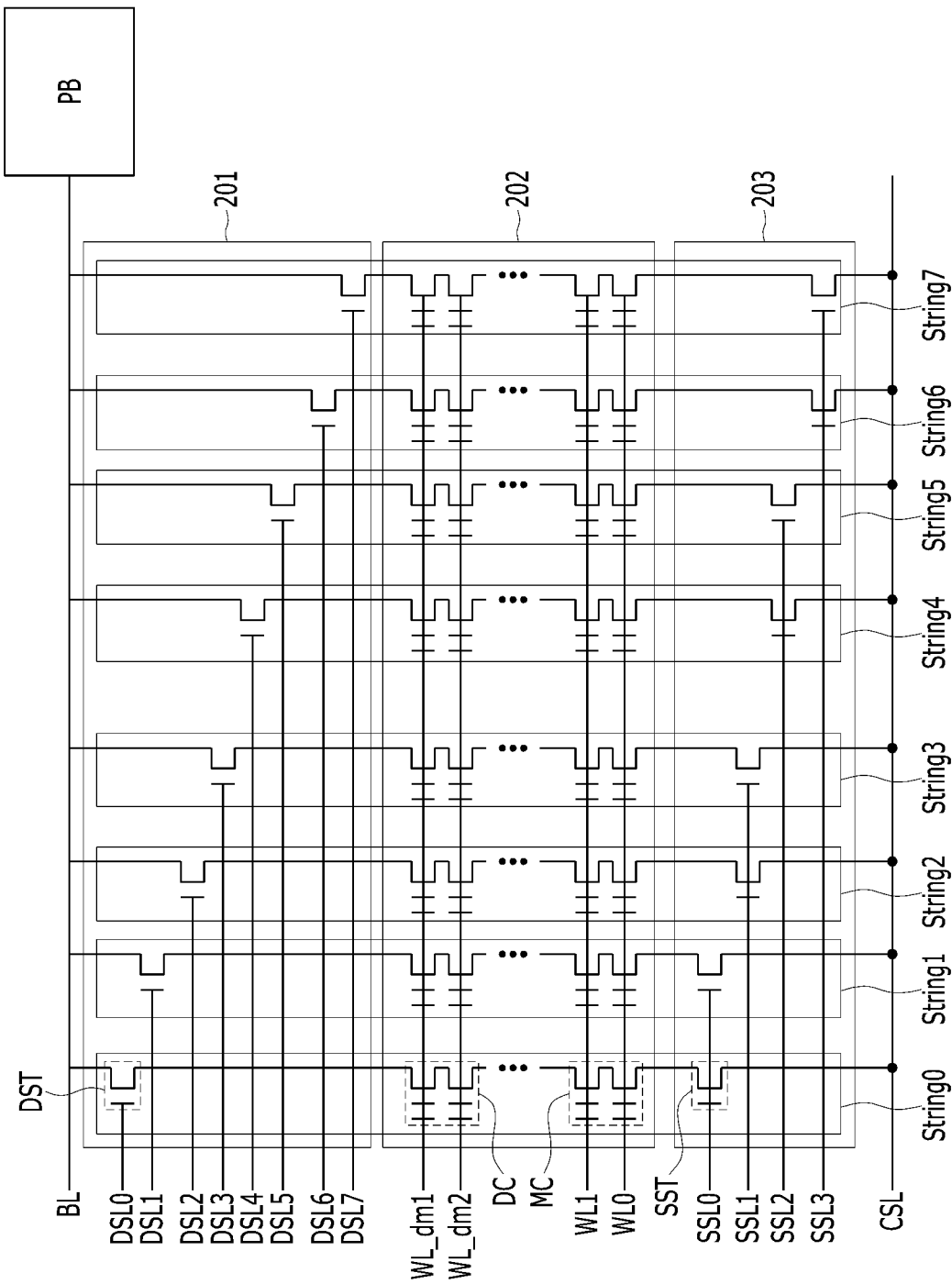
FIG. 2A is a diagram for describing a connection relationship among a bit line, memory strings, and a page buffer in accordance with an embodiment of the present disclosure.

FIG. 2A is a diagram for describing a connection relationship among a bit line, memory strings, and a page buffer in accordance with an embodiment of the present disclosure.

Referring to FIG. 2A, first to eighth memory strings String0 to String7 may be connected between one bit line BL and a common source line CSL. FIG. 2A illustrates a structure in which the eight memory strings String0 to String7 are connected between the one bit line BL and the common source line CSL; however, the number of memory strings is not limited.

Each of the first to eighth memory strings String0 to String7 may include a drain select transistor DST, a dummy cell DC, a memory cell MC, and a source select transistor SST.

Each of the first to eighth memory strings String0 to String7 may have a structure in which the drain select transistor DST, the memory cell MC, and the source select transistor SST are connected in series. In such a case, each of the first to eighth memory strings String0 to String7 may further include the dummy cell DC connected between the drain select transistor DST and the memory cell MC.

A gate of the drain select transistor DST included in each of the first to eighth memory strings String0 to String7 may be connected to each of first to eighth drain select lines DSL0 to DSL7.

A gate of the memory cell MC included in each of the first to eighth memory strings String0 to String7 may be connected to each of a plurality of word lines WL1 and WL2.

A gate of the source select transistor SST included in each of the first to eighth memory strings String0 to String7 may be connected to a corresponding source select line of first to fourth source select lines SSL0 to SSL3.

When each of the first to eighth memory strings String0 to String7 includes the dummy cell DC, a gate of the dummy cell DC may be connected to each of a plurality of dummy word lines WL_dm1 and WL_dm2. In such a case, each of the plurality of dummy word lines WL_dm1 and WL_dm2 may be driven to the pass voltage Vpass as in the plurality of word lines WL1 and WL2 during the threshold voltage variation verification on the drain or source select transistor.

The bit line BL may be connected to a page buffer PB.

Figure 2B:
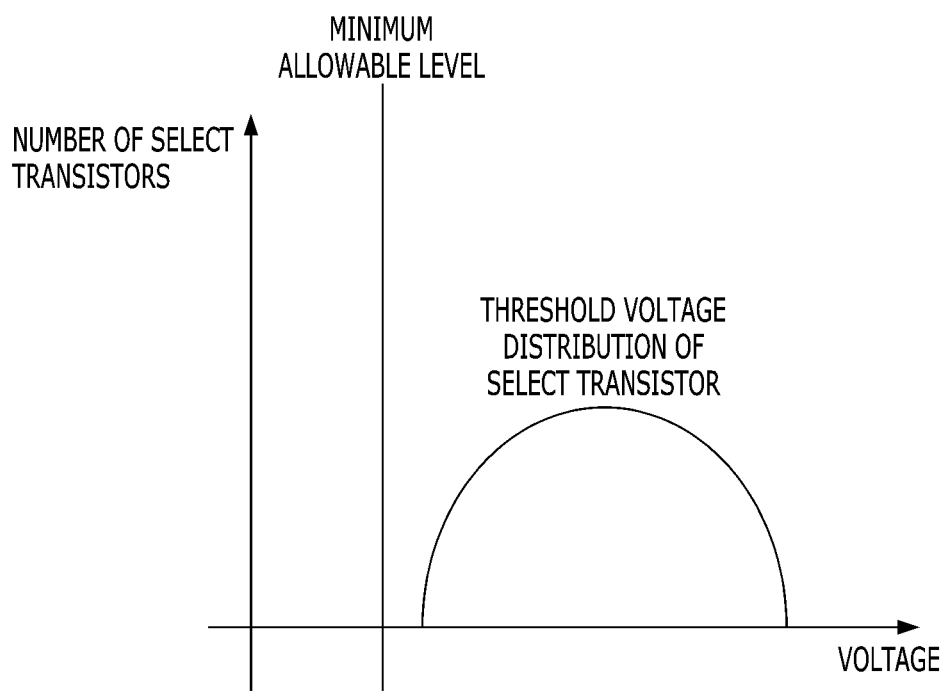
FIG. 2B is a diagram for describing a threshold voltage distribution range of a select transistor in accordance with an embodiment of the present disclosure.

FIG. 2B is a diagram for describing a threshold voltage distribution of the select transistor in accordance with an embodiment of the present disclosure.

Referring to FIG. 2B, the drain select transistor DST and the source select transistor SST may be turned on when a voltage level within a voltage range according to a threshold voltage distribution is applied to gates of the drain select transistor DST and the source select transistor SST. That is, when a voltage exceeding a minimum allowable level of the voltage range according to the threshold voltage distribution is applied to the gate, the drain select transistor DST or the source select transistor SST may be turned on. When a voltage below the minimum allowable level of the voltage range according to the threshold voltage distribution is applied to the gate, the drain select transistor DST or the source select transistor SST may be turned off.

For example, the drain select transistor DST of each of the first to eighth memory strings String0 to String7 configured as illustrated in FIG. 2A may configured to be turned on only when a voltage level of a drain select line connected to the gate thereof exceeds the minimum allowable level of the normal threshold voltage range. The source select transistor SST of each of the first to eighth memory strings String0 to String7 may also be configured to be turned on only when a voltage level of a source select line connected to the gate thereof exceeds the minimum allowable level of the normal threshold voltage range. The drain and source select transistors DST and SST of each of the first to eighth memory strings String0 to String7 need to be turned off when the voltage level of the drain select line or the source select line connected to the gate thereof is below the minimum allowable level. However, drain and source select transistors DST and SST that may deteriorate may be turned on when the voltage level of the drain select line or source select line connected to the gate thereof is below the minimum allowable level, which may cause the deterioration of the performance of the semiconductor device. Accordingly, the semiconductor device may perform the threshold voltage variation verification on the drain select transistor DST and the source select transistor SST after a program or erase operation.

The semiconductor device in accordance with an embodiment may perform, through one verification operation, the threshold voltage variation verification on the drain select transistor DST or the source select transistor SST included in each of the first to eighth memory strings String0 to String7.

In the following description, the drain select transistors DST included in the respective first to eighth memory strings String0 to String7 are referred to as a drain select transistor group 201. The dummy cells DC and the memory cells MC included in the respective first to eighth memory strings String0 to String7 are referred to as a cell group 202. The source select transistors SST included in the respective first to eighth memory strings String0 to String7 are referred to as a source select transistor group 203.

Figure 3A:
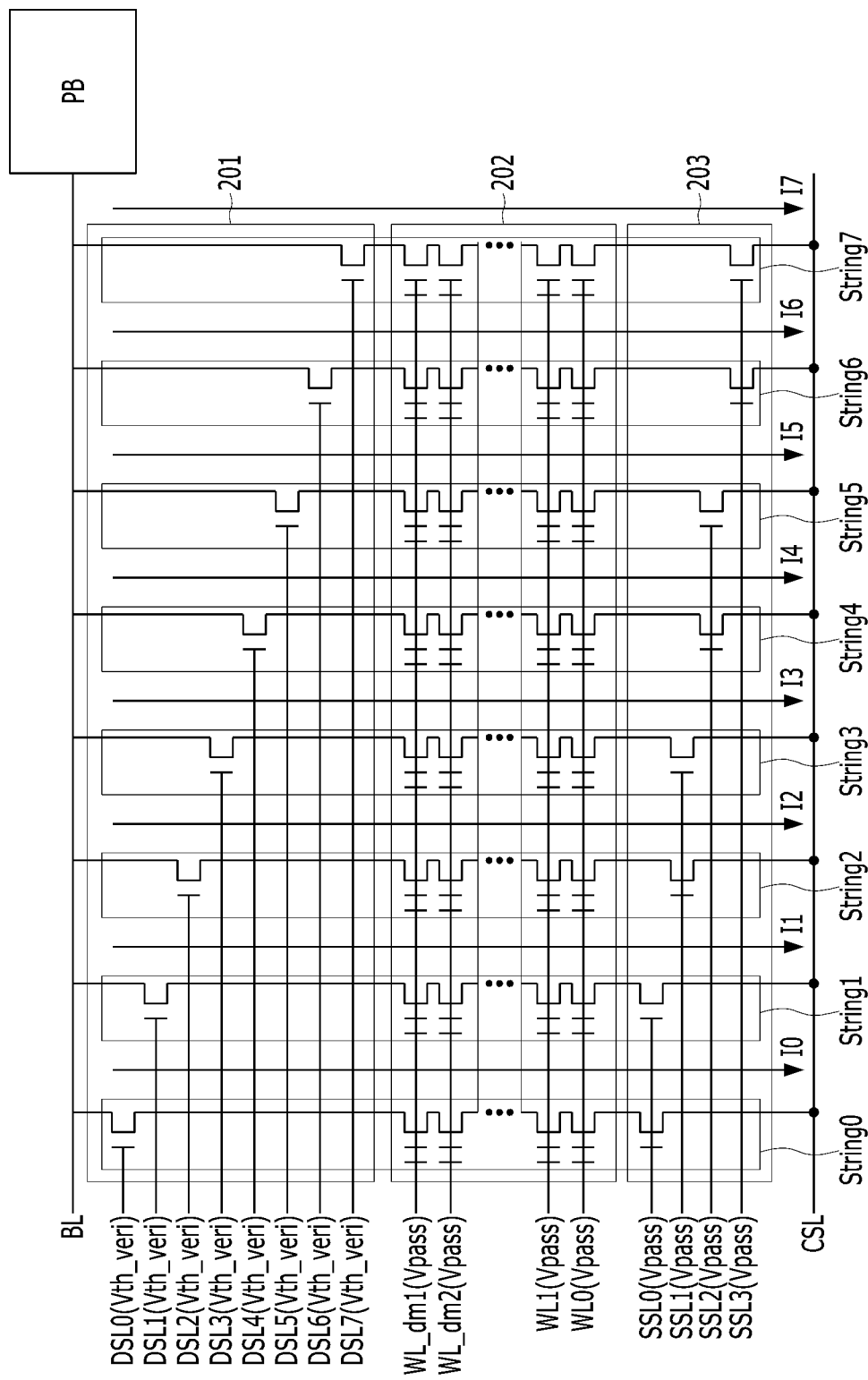
FIG. 3A and FIG. 3B are diagrams for describing a threshold voltage verification operation on a select transistor group in accordance with an embodiment of the present disclosure.
Figure 3B:
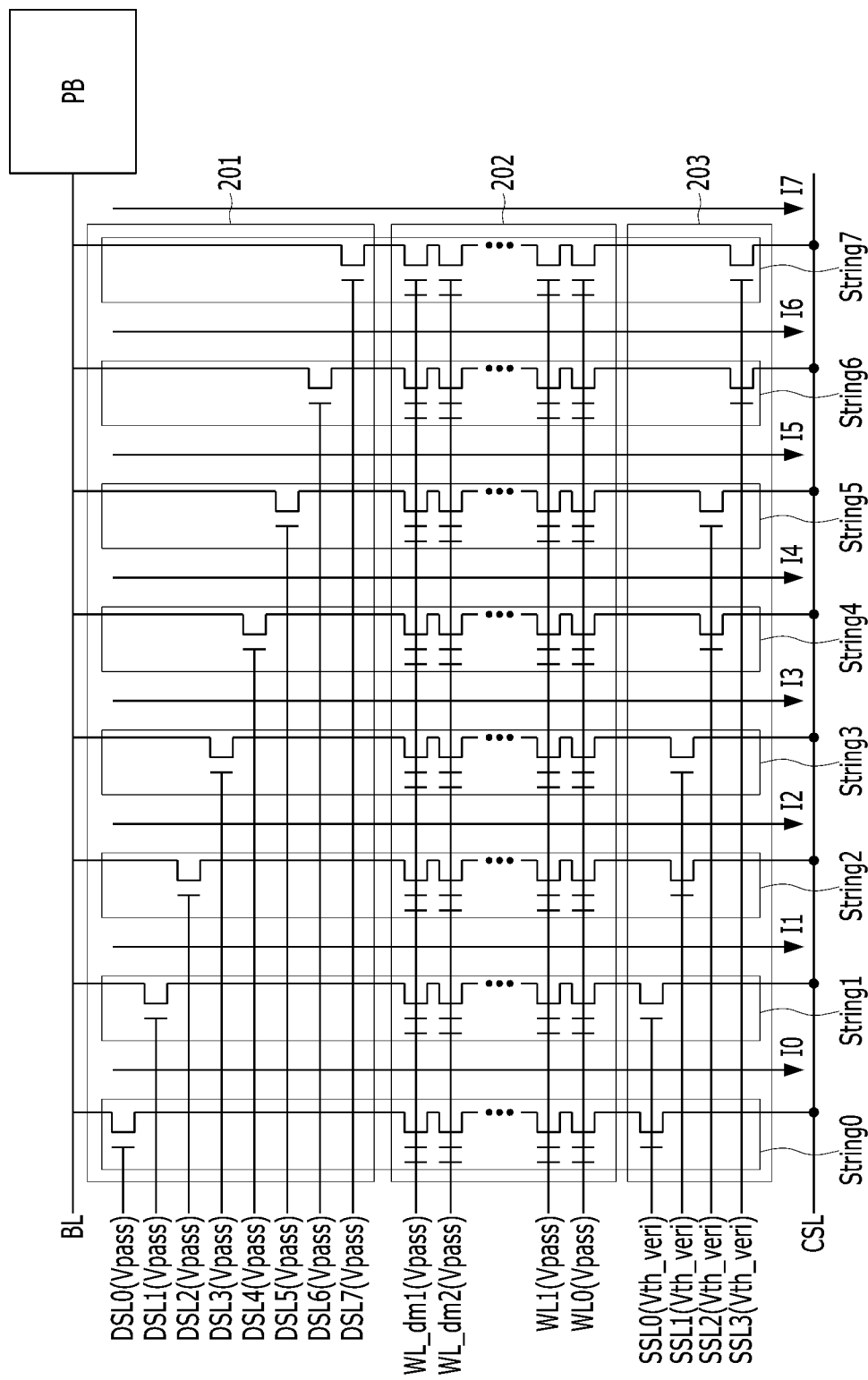

FIG. 3A and FIG. 3B are diagrams for describing a threshold voltage verification operation on a select transistor group in accordance with an embodiment of the present disclosure.

The semiconductor device in accordance with an embodiment may perform, through one verification operation, the threshold voltage variation verification on the drain select transistor group 201 included in all strings String0 to String7 connected between the bit line BL and the common source line CSL.

Referring to FIG. 3A, when the threshold voltage variation verification on the drain select transistor is performed, the threshold verification voltage Vth_veri may be provided to the drain select transistor group 201. The pass voltage Vpass may be provided to the cell group 202 and the source select transistor group 203.

For example, during the threshold voltage variation verification on the drain select transistors DST, the threshold verification voltage Vth_veri may be provided to the gates of the drain select transistors DST. The pass voltage Vpass may be applied to the gates of the dummy cells DC, the memory cells MC, and the second select transistors SST. In such a case, the operation of the semiconductor device 100 is described with reference to FIG. 1. The control circuit 110 may generate the voltage control signal V_ctrl and the drive address signal ADD_d on the basis of the command signal CMD and the address signal ADD. The voltage generation circuit 130 may generate the internal voltages V_int including the threshold verification voltage Vth_veri and the pass voltage Vpass on the basis of the voltage control signal V_ctrl. The line drive circuit 140 may drive the drain select lines DSL to the level of the threshold verification voltage Vth_veri on the basis of the drive address signal ADD_s, and may drive the word lines WL and the source select lines SSL to the level of the pass voltage Vpass. As a consequence, during the threshold voltage variation verification on the drain select transistors DST, the threshold verification voltage Vth_veri may be provided to the gates of the drain select transistors DST, and the pass voltage Vpass may be provided to the gates of the dummy cells DC, the memory cells MC, and the second select transistors SST. In such a case, the gates of the dummy cells DC may be provided with the dummy word lines WL_dm1 and WL_dm2 driven to the same level as the word lines WL, and the line drive circuit 140 may drive the dummy word lines WL_dm1 and WL_dm2 to the same level as the word lines WL during the threshold voltage variation verification.

The threshold verification voltage Vth_veri may have a level corresponding to the minimum allowable level of the normal threshold voltage range, and the pass voltage Vpass may have a voltage level which is within the normal threshold voltage range and at which the dummy cells DC and the memory cells MC may allow a current to pass therethrough regardless of programmed data.

Normal drain select transistors DST need to be turned on when a voltage exceeding the minimum allowable level of the normal threshold voltage range is received, and need to be turned off when the voltage below the minimum allowable level is received. Accordingly, the normal drain select transistors DST need to be turned off when the threshold verification voltage Vth_veri is received. However, drain select transistors DST, in which a threshold voltage variation occurs due to deterioration, may be turned on at the level of the threshold verification voltage Vth_veri.

Therefore, when the threshold verification voltage Vth_veri is provided to the drain select transistor DST and the pass voltage Vpass is provided to the dummy cell DC, the memory cell MC, and the second select transistor SST, no current path flowing from the bit line BL to the common source line CSL is formed in a string in which the normal drain select transistor DST, the dummy cell DC, the memory cell MC, and the source select transistor SST are connected in series.

When the threshold verification voltage Vth_veri is provided to the drain select transistor DST and the pass voltage Vpass is provided to the dummy cell DC, the memory cell MC, and the source select transistor SST, a current path flowing from the bit line BL to the common source line CSL may be formed in a string in which the drain select transistor DST that has deteriorated. The dummy cell DC, the memory cell MC, and the source select transistor SST are connected in series.

Accordingly, during the threshold voltage variation verification on the drain select transistor group 201, the semiconductor device in accordance with an embodiment may provide the threshold verification voltage Vth_veri to the drain select transistor group 201, provide the pass voltage Vpass to the cell group 202 and the source select transistor group 203, and check whether a current path is formed in the first to eighth memory strings String0 to String7, thereby verifying threshold voltage variations of the drain select transistors DST included in the drain select transistor group 201.

For example, during the threshold voltage variation verification on the drain select transistors DST, the semiconductor device in accordance with an embodiment may provide the threshold verification voltage Vth_veri to the gates of the drain select transistors DST, and provide the pass voltage Vpass to the gates of the dummy cells DC, the memory cells MC, and the source select transistors SST, thereby determining that the drain select transistors DST are normal when no current path is formed in the first to eighth memory strings String0 to String7.

During the threshold voltage variation verification on the drain select transistors DST, the semiconductor device in accordance with an embodiment may provide the threshold verification voltage Vth_veri to the gates of the drain select transistors DST, and provide the pass voltage Vpass to the gates of the dummy cells DC, and the memory cells MC, and the source select transistors SST, thereby determining that the threshold voltage of at least one of the drain select transistors DST has changed when a current path is formed even in any one of the first to eighth memory strings String0 to String7. In such a case, the semiconductor device may determine that the threshold voltage variation of the drain select transistor is caused by deterioration of the transistor.

The semiconductor device in accordance with an embodiment may also perform, through one verification operation, the threshold voltage variation verification on the source select transistor group 203 included in all strings String0 to String7 connected between the bit line BL and the common source line CSL.

Referring to FIG. 3B, when the threshold voltage variation verification on the source select transistor group 203 is performed, the threshold verification voltage Vth_veri may be provided to the source select transistor group 203, and the pass voltage Vpass may be provided to the drain select transistor group 201 and the cell group 202.

For example, during the threshold voltage variation verification on the source select transistors SST, the threshold verification voltage Vth_veri may be provided to the gates of the source select transistors SST, and the pass voltage Vpass may be applied to the gates of the drain select transistors DST, the dummy cells DC, and the memory cells MC.

In such a case, the voltage generation circuit 130 may generate the internal voltages V_int including the threshold verification voltage Vth_veri and the pass voltage Vpass on the basis of the voltage control signal V_ctrl. The line drive circuit 140 may drive the source select lines SSL to the level of the threshold verification voltage Vth_veri on the basis of the drive address signal ADD_s, and drive the drain select lines DSL and the word lines WL to the level of the pass voltage Vpass. As a consequence, during the threshold voltage variation verification on the source select transistors SST, the threshold verification voltage Vth_veri may be provided to the gates of the source select transistors SST, and the pass voltage Vpass may be provided to the gates of the drain select transistors DST, the dummy cells DC, and the memory cells MC.

Like the drain select transistors DST, normal source select transistors SST need to be turned on when a voltage exceeding the minimum allowable level of the normal threshold voltage range is received and need to be turned off when the voltage below the minimum allowable level is received. Accordingly, the normal source select transistors SST need to be turned off when the threshold verification voltage Vth_veri is received. However, source select transistors SST, in which a threshold voltage variation occurs due to deterioration, may be turned on at the level of the threshold verification voltage Vth_veri.

Therefore, when the threshold verification voltage Vth_veri is provided to the source select transistor SST and the pass voltage Vpass is provided to the drain select transistor DST, the dummy cell DC, and the memory cell MC, no current path flowing from the bit line BL to the common source line CSL is formed in a string in which the drain select transistor DST, the dummy cell DC, the memory cell MC, and the normal source select transistor SST are connected in series.

When the threshold verification voltage Vth_veri is provided to the source select transistor SST and the pass voltage Vpass is provided to the drain select transistor DST, the dummy cell DC, and the memory cell MC, a current path flowing from the bit line BL to the common source line CSL may be formed in a string in which the drain select transistor DST, the dummy cell DC, the memory cell MC, and the source select transistor SST that has deteriorated are connected in series.

Accordingly, during the threshold voltage variation verification on the source select transistor group 203, the semiconductor device in accordance with an embodiment may provide the threshold verification voltage Vth_veri to the source select transistor group 203, provide the pass voltage Vpass to the drain select transistor group 201 and the cell group 202, and check whether a current path is formed in the first to eighth memory strings String0 to String7, thereby verifying the threshold voltage variations of the source select transistors SST included in the source select transistor group 203.

For example, during the threshold voltage variation verification on the source select transistors SST, the semiconductor device in accordance with an embodiment may provide the threshold verification voltage Vth_veri to the gates of the source select transistors SST, thereby determining that the source select transistors SST are normal when no current path is formed in the first to eighth memory strings String0 to String7.

During the threshold voltage variation verification on the source select transistors SST, the semiconductor device in accordance with an embodiment may provide the threshold verification voltage Vth_veri to the gates of the source select transistors SST, thereby determining that the threshold voltage of at least one of the source select transistors SST has changed when a current path is formed even in one of the first to eighth memory strings String0 to String7. In such a case, the semiconductor device may determine that the threshold voltage variation of the source select transistor is caused by deterioration of the transistor.

An operation of checking whether a current path is formed in the first to eighth memory strings String0 to String7 is as follows.

During the threshold voltage variation verification on the drain or source select transistors DST and SST, the semiconductor device in accordance with an embodiment may sense a change in the voltage level of the bit line BL, thereby checking whether a current path is formed in the first to eighth memory strings String0 to String7.

A current path flowing from the bit line BL to the common source line CSL may be formed in a memory string including a drain select transistor DST or a source transistor SST that has deteriorated during the threshold voltage variation verification.

Referring to FIG. 3A and FIG. 3B, among the first to eighth memory strings String0 to String7, first to eighth current paths I0 to I7 may be formed through a memory string including a drain select transistor DST or a source transistor SST that has deteriorated.

The first to eighth current paths I0 to I7 may be currents flowing from the bit line BL to the common source line CSL.

Therefore, during the threshold voltage variation verification on the drain or source select transistors DST and SST, the semiconductor device in accordance with an embodiment may form the bit line BL to a preset voltage level, and provide the threshold verification voltage Vth_veri to the gates of the drain or source select transistors DST and SST. Subsequently, when even one of the first to eighth current paths I0 TO I7 is formed, the semiconductor device may determine that at least one of select transistors subjected to the threshold voltage variation verification has deteriorated.

During the threshold voltage variation verification on the drain or source select transistors DST and SST, when the first to eighth current paths I0 to I7 are not formed, the semiconductor device in accordance with an embodiment may determine that select transistors subjected to the threshold voltage variation verification are normal.

Accordingly, during the threshold voltage verification, the page buffer PB included in the semiconductor device in accordance with an embodiment may form the bit line BL to a preset voltage level and sense whether a current path is formed in the bit line BL, thereby generating the threshold voltage variation verification result Check_r for the select transistors. During the threshold voltage variation verification on the select transistors by the semiconductor device in accordance with an embodiment, when the page buffer PB senses the current path of the bit line BL, the page buffer PB may generate the signal having the first level and provide the control circuit 110 with the signal having the first level as the threshold voltage variation verification result Check_r. During the threshold voltage variation verification on the select transistors by the semiconductor device in accordance with an embodiment, when the page buffer PB senses no current path of the bit line BL, the page buffer PB may generate the signal having the second level and provide the control circuit 110 with the signal having the second level as the threshold voltage variation verification result Check_r. In such a case, the first level and the second level may be different levels, and when a signal provided from the page buffer PB to the control circuit 110 is a digital signal, the first level and the second level may correspond to a high level and a low level, respectively.

As a consequence, during the threshold voltage variation verification on the select transistors by the semiconductor device in accordance with an embodiment, the level of the signal provided from the page buffer PB to the control circuit 110 as the threshold voltage variation verification result Check_r may include information on whether the threshold voltages of the select transistors that are verified are changed. Since the threshold voltage variations of the select transistors are caused by deterioration of the select transistors, the level of the signal provided from the page buffer PB to the control circuit 110 as the threshold voltage variation verification result Check_r may include information on whether the select transistors have deteriorated.

The configuration and operation of the page buffer PB operating in this way are described with reference to FIG. 4 and FIG. 5.

Figure 4:
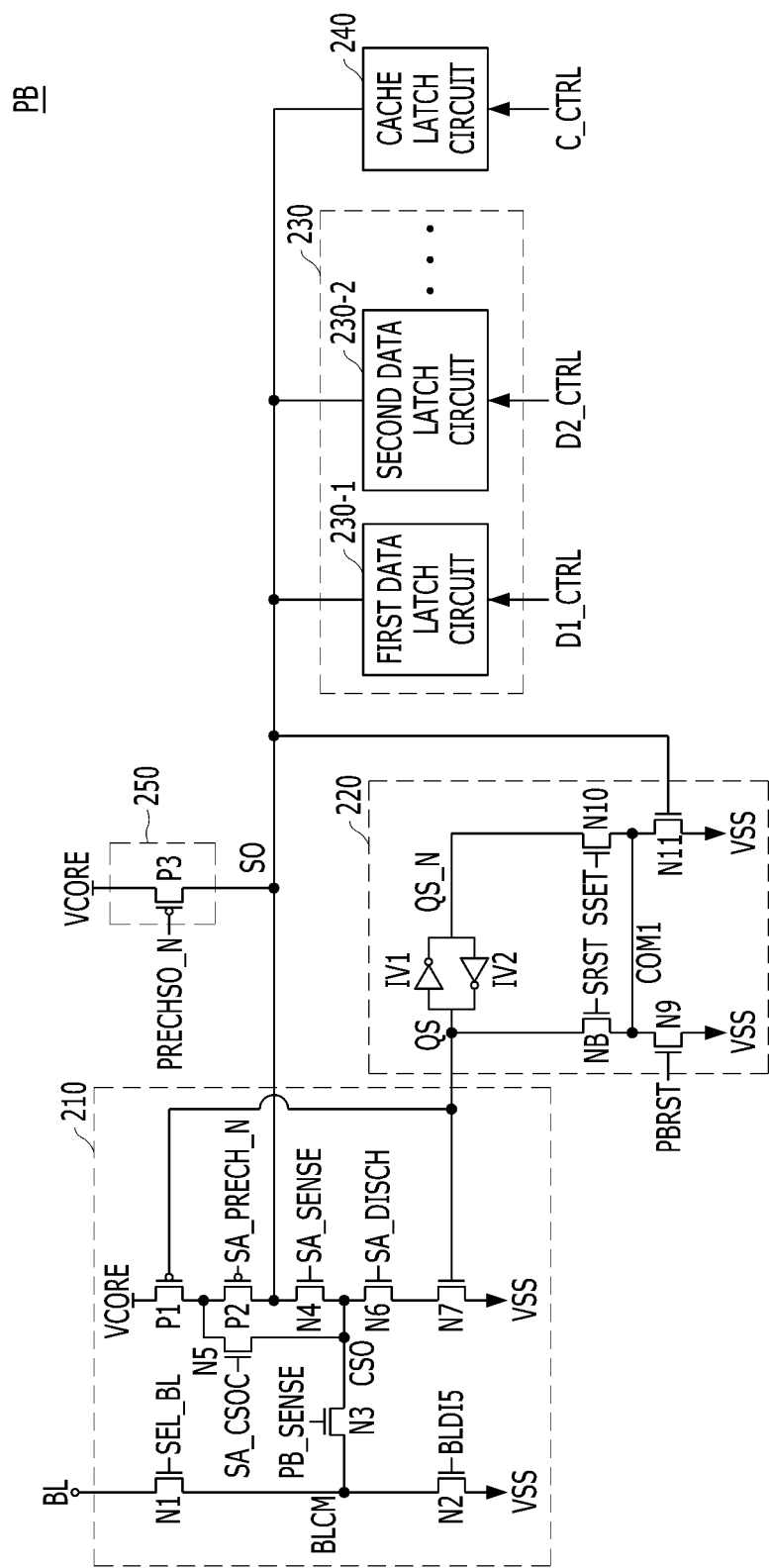
FIG. 4 is a diagram illustrating the configuration of a page buffer in accordance with an embodiment of the present disclosure.

FIG. 4 is a diagram illustrating the configuration of the page buffer PB in accordance with an embodiment of the present disclosure.

Referring to FIG. 4, the page buffer PB may include a bit line connection circuit 210, a sensing latch circuit 220, a data latch group 230, a cache latch circuit 240, and a precharge circuit 250. In such a case, the page buffer control signal PB_ctrl of FIG. 1 may include a plurality of control signals SEL_BL, PB_SENSE, BLDIS, SA_CSOC, SA_PRECH_N, SA_SENSE, SA_DISCH, PRECHSO_N, PBRST, SRST, SSET, D1_CTRL, D2_CTRL, and C_CTRL. For convenience of description, the plurality of control signals SEL_BL, PB_SENSE, BLDIS, SA_CSOC, SA_PRECH_N, SA_SENSE, SA_DISCH, PRECHSO_N, PBRST, SRST, SSET, D1_CTRL, D2_CTRL, and C_CTRL are divided into a first control signal group SEL_BL, PB_SENSE, BLDIS, SA_CSOC, SA_PRECH_N, SA_SENSE, and SA_DISCH, a second control signal group PBRST, SRST, and SSET, a third control signal group D1_CTRL, D2_CTRL, and C_CTRL, and a sense node precharge signal PRECHSO_N.

The bit line connection circuit 210 may form the bit line BL to a preset voltage level on the basis of the first control signal group SEL_BL, PB_SENSE, BLDIS, SA_PRECH_N, SA_SENSE, and SA_DISCH, and electrically connect or disconnect the bit line BL to/from a sensing node SO.

For example, the bit line connection circuit 210 may include first to ninth transistors N1 to N7, P1, and P2, and may be configured to form the bit line BL to a preset voltage level under the control of the first control signal group SEL_BL, PB_SENSE, BLDIS, SA_CSOC, SA_PRECH_N, SA_SENSE, and SA_DISCH, and to electrically connect or disconnect the bit line BL to or from the sensing node SO.

The sensing latch circuit 220 may sense a voltage level of the sensing node SO on the basis of the second control signal group PBRST, SRST, and SSET and latch the sensed voltage level, or latch the preset voltage level regardless of the voltage level of the sensing node SO. For example, the sensing latch circuit 220 may include tenth to thirteenth transistors N8 to N11, a first inverter IV1, and a second inverter IV2, and may be configured to sense the voltage level of the sensing node SO under the control of the second control signal group PBRST, SRST, and SSET and latch the sensed voltage level, or to latch the preset voltage level regardless of the voltage level of the sensing node SO.

On the basis of some D1_CTRL and D2_CTRL of the third control signal group D1_CTRL, D2_CTRL, and C_CTRL, the data latch group 230 may store, as data, the voltage level latched by the sensing latch circuit 220. The data latch group 230 may include a plurality of data latch circuits 230-1 and 230-2 corresponding to the number of data distributions stored in a data cell.

The cache latch circuit 240 may receive the data stored in the plurality of data latch circuits 230-1 and 230-2 on the basis of the remainder C_CTRL of the third control signal group D1_CTRL, D2_CTRL, and C_CTRL, and output the received data as the output of the page buffer PB, that is, the threshold voltage verification result Check_r.

The precharge circuit 250 may form the sensing node SO to a precharge voltage level on the basis of the sense node precharge signal PRECHSO_N. For example, the precharge circuit 250 may include a fourteenth transistor P3 and may be configured to apply a core voltage VCORE to the sensing node SO when the fourteenth transistor P3 is turned on under the control of the sense node precharge signal PRECHSO_N. In such a case, the sensing node SO may be formed to a precharge voltage level.

The operation of the page buffer in accordance with an embodiment configured described above is described in more detail with reference to FIG. 5A and FIG. 5B.

Figure 5A:
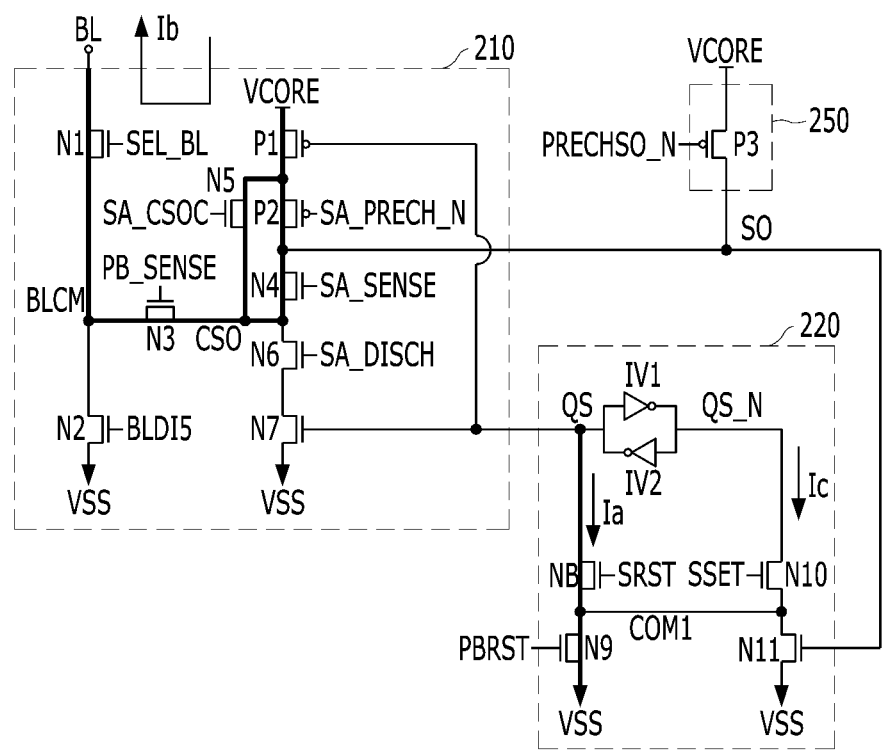
FIG. 5A and FIG. 5B are diagrams for describing an operation of the page buffer during the threshold voltage verification operation on the select transistor group in accordance with an embodiment of the present disclosure.
Figure 5B:
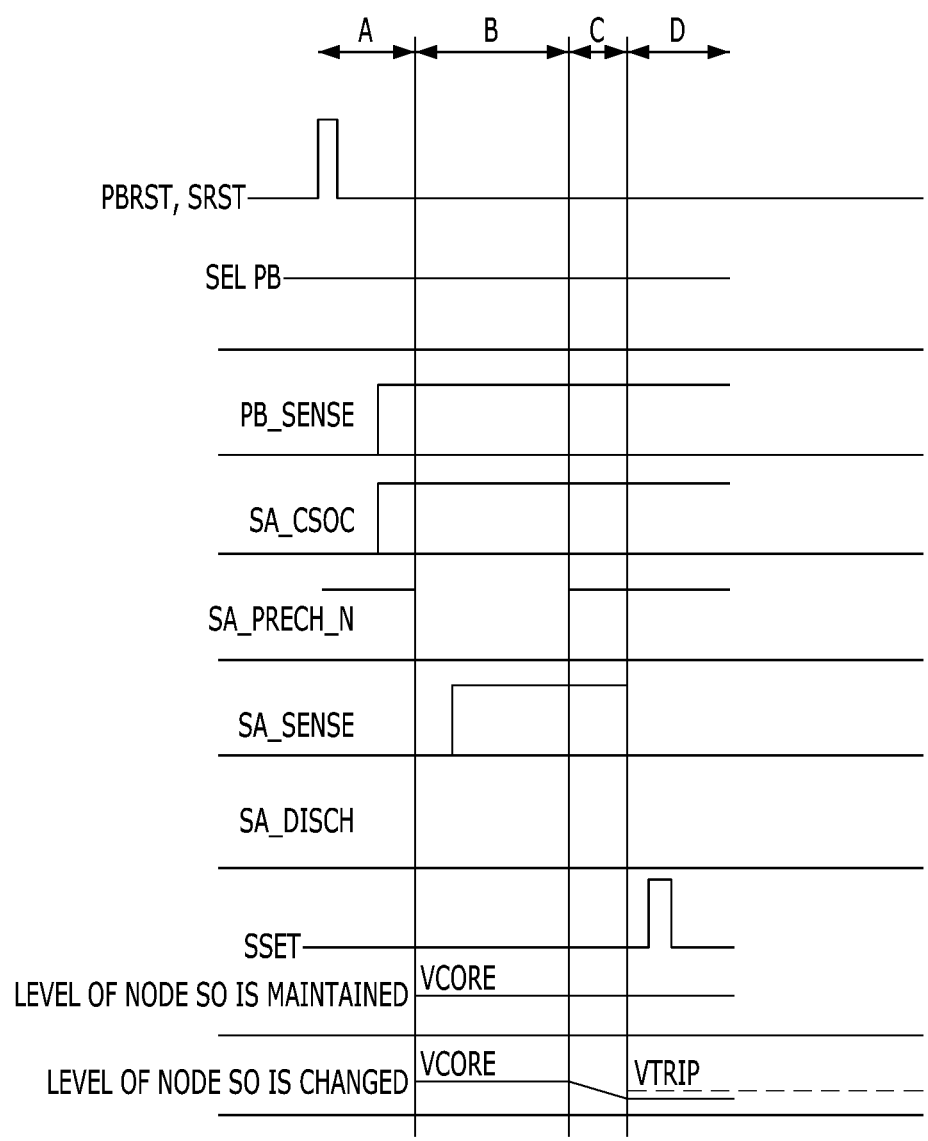

FIG. 5A and FIG. 5B are diagrams for describing the operation of the page buffer during the threshold voltage verification operation on the select transistor group in accordance with an embodiment of the present disclosure. The display of levels of the first control signal group SEL_BL, PB_SENSE, BLDIS, SA_CSOC, SA_PRECH_N, SA_SENSE, and SA_DISCH and the second control signal group PBRST, SRST, and SSET illustrated in FIG. 5A and FIG. 5B is merely an example for describing turn-on and turn-off states of transistors according to the type of transistor (for example, N or P type) to which each control signal is input, but is not limited thereto.

Referring to FIG. 5B, the operation of the page buffer in accordance with an embodiment may include an initialization operation A, a bit line voltage forming operation B, an evaluation operation C, and a latch operation D.

The initialization operation A may be an operation of initializing a latch value of the sensing latch circuit 220 illustrated in FIG. 5A. For example, the initialization operation A may include an operation of forming (initializing) a QS node to a low level by forming a current path Ia by turning on the tenth and eleventh transistors N9 and N10 under the control of the second control signal group PBRST and SRST. The level of a QS_N node may be opposite to the level of the QS node. Therefore, during the initialization operation, the QS node may have a low level and the QS_N node may have a high level. In such a case, when the QS node is formed to a low level, the seventh transistor N7 of the bit line connection circuit 210 may be turned off and the eighth transistor P1 thereof may be turned on.

The bit line voltage forming operation B may be an operation of forming the bit line BL to the preset voltage level. For example, the bit line voltage forming operation B may include an operation in which the first transistor N1, the third transistor N3, the fourth transistor N4, the fifth transistor N5, and the ninth transistor P2 of the bit line connection circuit 210 are turned on, and the second transistor N2 and the sixth transistor N6 of the bit line connection circuit 210 are turned off under the control of the first control signal group SEL_BL, PB_SENSE, BLDIS, SA_CSOC, SA_PRECH_N, SA_SENSE, and SA_DISCH. In such a case, as illustrated in FIG. 5A, a current path Ib may be formed through the turned-on first transistor N1, third transistor N3, fourth transistor N4, fifth transistor N5, and ninth transistor P2, so that the voltage level of the bit line BL may be formed to the preset voltage level.

The evaluation operation C may include an operation of blocking the current path Ib illustrated in FIG. 5A or reducing the amount of current supplied to the bit line BL through the current path Ib. For example, the evaluation operation C may include an operation of turning off the ninth transistor P2 in the turned-on state under the control of the first control signal group SEL_BL, PB_SENSE, BLDIS, SA_CSOC, SA_PRECH_N, SA_SENSE, and SA_DISCH, and reduce the amount of current supplied to the bit line BL.

In such a case, in the state in which the amount of current supplied to the bit line BL is reduced, when a current path is formed even in one of the memory strings String0 to String7 between the bit line BL and the common source line CSL, the voltage level of the sensing node SO may also be lowered. However, when no current path is formed in the memory strings String0 to String7 between the bit line BL and the common source line CSL, the voltage level of the sensing node SO may also be maintained.

The latch operation D may include an operation of storing the voltage level of the sensing node SO after the evaluation operation C. For example, the latch operation D may include an operation of turning on the twelfth transistor N10 of the latch sensing circuit 220 illustrated in FIG. 5A under the control of the second control signal group PBRST, SRST, and SSET. In a case where the voltage level of the sensing node SO is lowered during the evaluation operation C and the thirteenth transistor N11 is turned off, even though the twelfth transistor N10 is turned on, a current path Ic is not formed. Therefore, the level of the QS_N node may maintain the level during the initialization operation. In a case where the voltage level of the sensing node SO is maintained during the evaluation operation C, the thirteenth transistor N11 is in a turned-on state. Therefore, when the twelfth transistor N10 is turned on during the latch operation D, the current pass Ic may be formed, so that the level of the QS_N node may be opposite to the level during the initialization operation. In such a case, the thirteenth transistor N11, to which the sensing node SO is connected to the gate thereof, may be configured to be turned off when the voltage level of the sensing node SO is lowered below a trip voltage VTRIP, and to be turned on when the voltage level of the sensing node SO is above the trip voltage VTRIP.

The page buffer that performs the threshold voltage variation verification in accordance with an embodiment may maintain a value (for example, QS node: low level, QS_N node: high level) latched during the initialization operation when a current path is formed in memory strings between the bit line BL and the common source line CSL, and store a level (for example, QS node: high level, QS_N node: low level) opposite to the value latched during the initialization operation when no current path is formed in the memory strings.

As a consequence, the page buffer in accordance with an embodiment may initialize a value latched in the sensing latch circuit 220 during the threshold voltage variation verification on select transistors, and maintain the latched initialization value when deterioration occurs in at least one of the select transistors that are verified. In such a case, the verification result Check_r output from the page buffer PB may include fail information. The page buffer in accordance with an embodiment may also change the latched initialization value when all select transistors that are verified are normal. In such a case, the verification result Check_r output from the page buffer PB may include pass information.

As illustrated in FIG. 1, since the bit lines BL1, BL2, . . . , BLm and the page buffers PB1, PB2, . . . , PBm are connected in a one-to-one fashion, the semiconductor device in accordance with an embodiment may verify, through one verification operation, threshold voltage variations of drain select transistors included in all memory strings of a memory block selected by the line drive circuit 140, as described. Furthermore, the semiconductor device may also verify, through one verification operation, threshold voltage variations of source select transistors.

Figure 6:
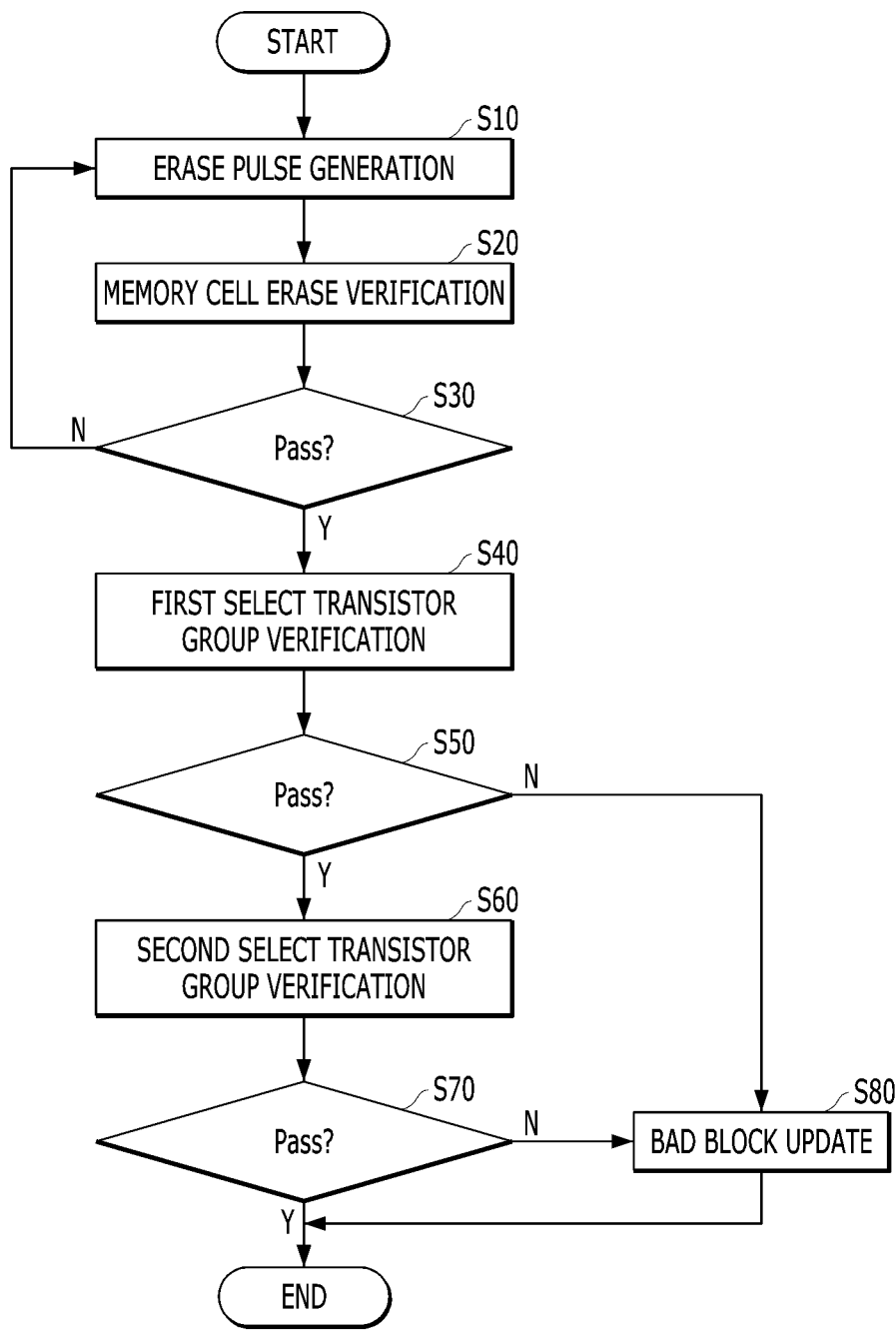
FIG. 6 is a flowchart for describing the threshold voltage verification operation on the select transistor group in accordance with an embodiment of the present disclosure.

FIG. 6 is a flowchart for describing the threshold voltage verification operation on the select transistor group in accordance with an embodiment of the present disclosure. FIG. 6 illustrates, as an example, an erase operation including the threshold voltage variation verification operation on the select transistor group in accordance with an embodiment as an example; however, the present disclosure is not limited thereto.

Referring to FIG. 6, the operating method of the semiconductor device in accordance with an embodiment may include an erase pulse generation operation S10, a memory cell erase verification operation S20, a first check operation S30, a first select transistor group verification operation S40, a second check operation S50, a second select transistor group verification operation S60, a third check operation S70, and a bad block update operation S80.

The erase pulse generation operation S10 may include an operation of generating an erase pulse and erasing programmed data of memory cells included in a selected memory block.

The memory cell erase verification operation S20 may include an operation of verifying whether the data of the memory cells have been normally erased.

The first check operation S30 may include an operation of causing the first select transistor group verification operation S40 to be performed when it is checked in the memory cell erase verification operation S20 that the data of the memory cells have been normally erased (Y), and causing the erase pulse generation operation S10 to be performed again when it is checked in the memory cell erase verification operation S20 that the data of the memory cells have not been normally erased (N).

The first select transistor group verification operation S40 may include an operation of verifying threshold voltage variations of drain select transistors constituting all memory strings included in the memory block from which the data of the memory cells have been erased.

For example, the first select transistor group verification operation S40 may be an operation of verifying at once whether threshold voltages of the drain select transistors exceed a minimum allowable level.

More specifically, the first select transistor group verification operation S40 may include an operation of driving the drain select lines of the memory block to a voltage level (for example, the level of the threshold verification voltage Vth_veri) corresponding to the minimum allowable level, and driving the word lines and the source select lines thereof to the level of the pass voltage Vpass. The first select transistor group verification operation S40 may further include an operation of forming the voltage levels of the bit lines to a preset voltage level, sensing whether a current path is formed in each bit line, and verifying whether the threshold voltages of the drain select transistors exceed the minimum allowable level.

The second check operation S50 may cause the second select transistor group verification operation S60 to be performed when the number of drain select transistors whose threshold voltages exceed the minimum allowable level in the first select transistor group verification operation S40 exceeds a set number (Y). The second check operation S50 may include an operation of causing the bad block update operation S80 to be performed when the number of drain select transistors whose threshold voltages do not exceed the minimum allowable level in the first select transistor group verification operation S40 exceeds the set number (N). In such a case, when the number of verification results including pass information and output from the page buffers PB1, PB2, . . . , PBm in the first select transistor group verification operation S40 exceeds the set number (N), the second check operation S50 may cause the bad block update operation S80 to be performed.

The second select transistor group verification operation S60 may include an operation of verifying threshold voltage variations of source select transistors of the memory block subjected to the first select transistor group verification operation S40.

For example, the second select transistor group verification operation S60 may be an operation of verifying at once whether the threshold voltages of the source select transistors exceed the minimum allowable level.

More specifically, the second select transistor group verification operation S60 may include an operation of driving source select lines of the memory block subjected to the first select transistor group verification operation S40 to the voltage level (for example, the level of the threshold verification voltage Vth_veri) corresponding to the minimum allowable level, and driving the word lines and the drain select lines thereof to the level of the pass voltage Vpass. The second select transistor group verification operation S60 may further include an operation of forming the voltage levels of the bit lines to the preset voltage level, sensing whether a current path is formed in each bit line, and verifying whether the threshold voltages of the source select transistors exceed the minimum allowable level.

When the number of source select transistors whose threshold voltages exceed the minimum allowable level in the second select transistor group verification operation S60 exceeds the set number in the third check operation S70, (Y), the operating method of the semiconductor device in accordance with an embodiment may be ended. The third check operation S70 may include an operation of causing the bad block update operation S80 to be performed when the number of source select transistors whose threshold voltages do not exceed the minimum allowable level in the second select transistor group verification operation S60 exceeds the set number (N). In such a case, when the number of verification results indicating fail and output from the page buffers PB1, PB2, . . . , PBm in the second select transistor group verification operation S60 exceeds the set number (N), the third check operation S70 may cause the bad block update operation S80 to be performed.

The bad block update operation S80 may include an operation of determining the memory block as a bad block when the number of select transistors that deteriorate among the select transistors verified in the first and second select transistor group verification operations S40 and S60 exceeds the set number.

As a consequence, the operating method of the semiconductor device in accordance with an embodiment may perform threshold voltage variation verification on a select transistor group of the same type through one verification operation, thereby reducing the time required for the threshold voltage variation verification on the select transistor, and improving operation reliability of the semiconductor device by processing, as a bad block, a memory block included in the select transistor group whose threshold voltage variation is sensed.

Figure 7:
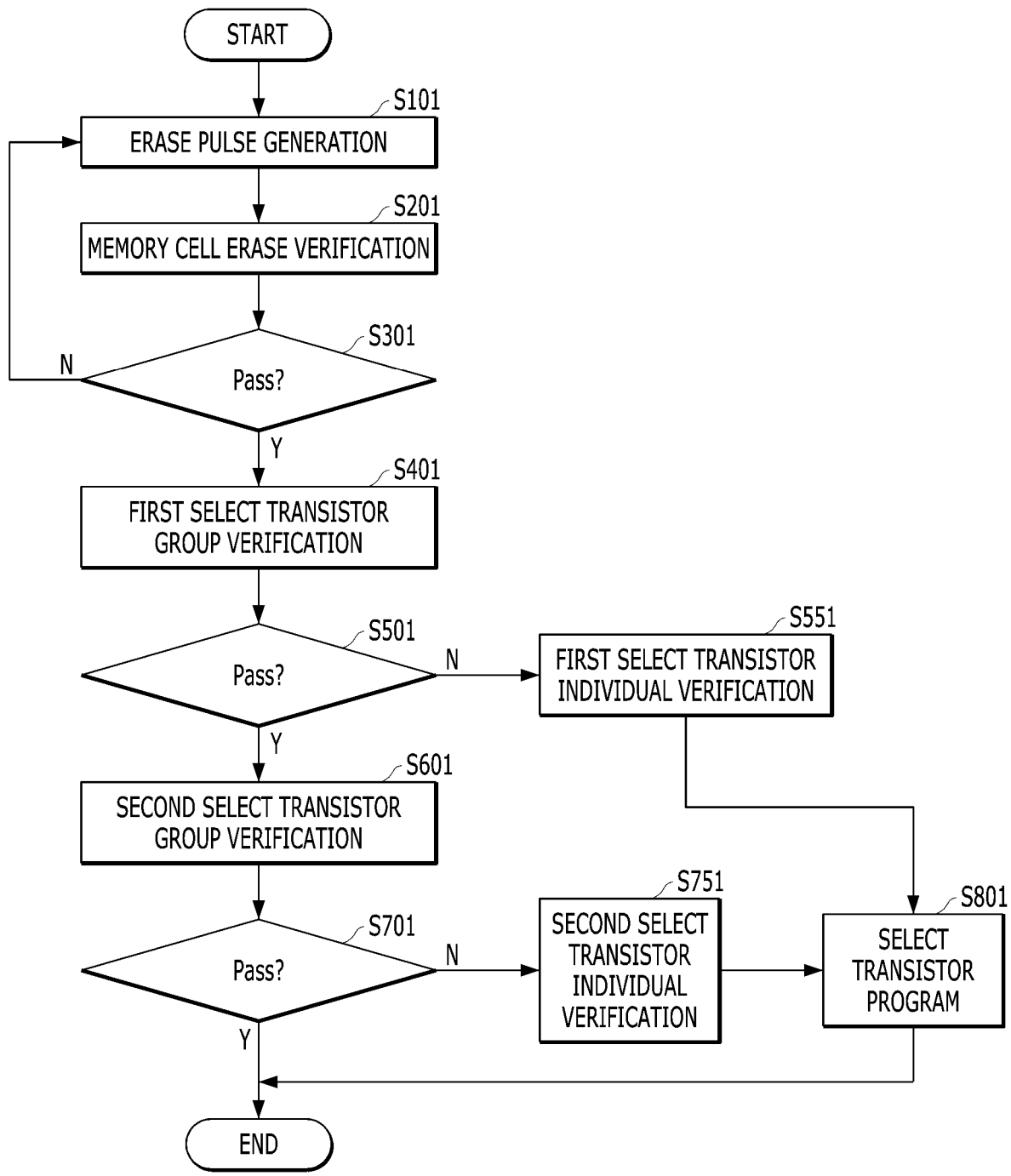
FIG. 7 is a flowchart for describing the threshold voltage verification operation on the select transistor group in accordance with another embodiment of the present disclosure.

FIG. 7 is a flowchart for describing the threshold voltage verification operation on the select transistor group in accordance with another embodiment of the present disclosure.

The operating method of the semiconductor device in accordance with another embodiment illustrated in FIG. 7 may include an erase pulse generation operation S101, a memory cell erase verification operation S201, a first check operation S301, a first select transistor group verification operation S401, a second check operation S501, a first select transistor individual verification operation S551, a second select transistor group verification operation S601, a third check operation S701, a second select transistor individual verification operation S751, and a select transistor program operation S801.

The erase pulse generation operation S101 may include an operation of generating an erase pulse and erasing programmed data of memory cells included in a selected memory block.

The memory cell erase verification operation S201 may include an operation of verifying whether the memory cells included in the memory block subjected to the erase pulse generation operation S101 have been normally erased.

The first check operation S301 may include an operation of causing the first select transistor group verification operation S401 to be performed when it is checked in the memory cell erase verification operation S201 that the data of the memory cells have been normally erased (Y), and causing the erase pulse generation operation S101 to be performed again when it is checked in the memory cell erase verification operation S201 that the data of the memory cells have not been normally erased (N).

The first select transistor group verification operation S401 may include an operation of verifying threshold voltage variations of drain select transistors constituting all memory strings included in the memory block.

For example, the first select transistor group verification operation S401 may be an operation of verifying at once whether threshold voltages of the drain select transistors exceed the minimum allowable level.

The second check operation S501 may cause the second select transistor group verification operation S601 to be performed when it is checked in the first select transistor group verification operation S401 that the threshold voltages of the drain select transistors exceed the minimum allowable level (Y). The second check operation S501 may include an operation of causing the first select transistor individual verification operation S551 to be performed when the number of drain select transistors whose threshold voltages do not exceed the minimum allowable level in the first select transistor group verification operation S401 exceeds a set number (N). In such a case, when the number of verification results indicating fail and output from the page buffers PB1, PB2, . . . , PBm in the first select transistor group verification operation S401 exceeds the set number (N), the second check operation S501 may cause the first select transistor individual verification operation S551 to be performed.

The first select transistor individual verification operation S551 may include an operation of sequentially verifying whether the threshold voltage of each drain select transistor of the memory strings connected between the bit line and the common source line exceeds the minimum allowable level. For example, when there are 8 memory strings connected between the bit line and the common source line, the first select transistor individual verification operation S551 may sequentially perform 8 times a threshold voltage verification operation on the drain select transistor of each of the 8 memory strings. Accordingly, the first select transistor individual verification operation S551 may search for a memory string including a drain select transistor that has deteriorated among the 8 memory strings. More specifically, the first select transistor individual verification operation S551 may include an operation of driving one of the first to eighth drain select lines DSL0 to DSL7 to the level of the threshold verification voltage Vth_veri, driving, to the level of the pass voltage Vpass, a word line and a source select line connected to a memory cell and a source select transistor of a memory string including a drain select transistor receiving the level of the threshold verification voltage Vth_veri, and then sensing whether a current path is formed in a bit line BL to which the drain select transistor receiving the threshold verification voltage Vth_veri is connected, thereby checking a threshold voltage variation of each drain select transistor. In such a case, when the current path of the bit line BL is sensed, the semiconductor device may determine that the threshold voltage of a corresponding drain select transistor has changed.

The second select transistor group verification operation S601 may include an operation of verifying threshold voltage variations of source select transistors included in the memory block subjected to the first select transistor group verification operation S401.

For example, the second select transistor group verification operation S601 may be an operation of verifying at once whether the threshold voltages of the source select transistors exceed the minimum allowable level.

When the number of drain select transistors whose threshold voltages exceed the minimum allowable level in the second select transistor group verification operation S601 exceeds a set number in the third check operation S701 (Y), the operating method of the semiconductor device in accordance with another embodiment may be ended. The third check operation S701 may include an operation of causing the second select transistor individual verification operation S751 to be performed when the number of drain select transistors whose threshold voltages do not exceed the minimum allowable level in the second select transistor group verification operation S601 exceeds the set number (N). In such a case, when the number of verification results indicating fail and output from the page buffers PB1, PB2, . . . , PBm in the second select transistor group verification operation S601 exceeds the set number (N), the third check operation S701 may cause the second select transistor individual verification operation S751 to be performed.

The second select transistor individual verification operation S751 may include an operation of sequentially verifying whether the threshold voltage of each source select transistor of the memory strings connected between the bit line and the common source line exceeds the minimum allowable level. For example, when there are 8 memory strings connected between the bit line and the common source line, the second select transistor individual verification operation S751 may sequentially perform 8 times a threshold voltage verification operation on the source select transistor of each of the 8 memory strings. Accordingly, the second select transistor individual verification operation S751 may search for a memory string including a source select transistor that has deteriorated among the 8 memory strings. More specifically, the second select transistor individual verification operation S751 may include an operation of driving one of first to eighth source select lines SSL0 to SSL7 to the level of the threshold verification voltage Vth_veri, driving, to the level of the pass voltage Vpass, a word line and a drain select line connected to a memory cell and a drain select transistor of a memory string including a source select transistor receiving the level of the threshold verification voltage Vth_veri, and then sensing whether a current path is formed in a bit line BL connected to the memory string including the source select transistor receiving the threshold verification voltage Vth_veri, thereby checking a threshold voltage variation of each source select transistor. In such a case, when the voltage level of the bit line BL is lowered, the semiconductor device may determine that the threshold voltage of a corresponding source select transistor has changed.

The select transistor program operation S801 may include an operation of returning the threshold voltage of a select transistor, which has deteriorated and is included in the memory string searched in the first select transistor individual verification operation S551 or the second select transistor individual verification operation S751, to a voltage range of a normal threshold voltage distribution.

For example, the select transistor program operation S801 may include an operation of reprogramming the select transistor of a memory string searched as the memory string, in which deterioration has occurred in the memory block subjected to the first select transistor individual verification operation S551 or the second select transistor individual verification operation S751, and returning the threshold voltage of the select transistor to the voltage range of the normal threshold voltage distribution.

As a consequence, the operating method of the semiconductor device in accordance with another embodiment may perform threshold voltage variation verification on a select transistor group of the same type through one verification operation, thereby reducing the time required for the threshold voltage variation verification when no threshold voltage variation of a select transistor is sensed. Furthermore, when a select transistor group whose threshold voltage variation is sensed is checked, the semiconductor device may search for a memory string including a select transistor that has deteriorated, and reprogram the select transistor of the searched memory string to return the threshold voltage of the select transistor to the normal threshold voltage range, thereby improving the operation reliability of the semiconductor device.

Although embodiments according to the technical idea of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure. Furthermore, the embodiments may be combined to form additional embodiments.

What is claimed is:

1. A semiconductor device comprising:
a memory cell array including a memory block including a plurality of memory strings connected between a plurality of bit lines and a common source line;
a control circuit that generates a page buffer control signal, a voltage control signal, and a drive address signal on the basis of a command signal and an address signal;
a page buffer group including a plurality of page buffers and configured to:
form each of the plurality of bit lines to a preset voltage level on the basis of the page buffer control signal during threshold voltage variation verification on a plurality of select transistors included in the plurality of memory strings, and
generate a threshold voltage variation result on the basis of whether a current path is formed in each of the plurality of bit lines;
a voltage generation circuit that generates a threshold verification voltage and a pass voltage on the basis of the voltage control signal; and a line drive circuit that drives a plurality of select lines to a level of the threshold verification voltage on the basis of the drive address signal and drives a plurality of word lines to a level of the pass voltage, during the threshold voltage variation verification.

2. The semiconductor device of claim 1, wherein:
the plurality of select transistors include a plurality of drain select transistors,
the plurality of select lines include a plurality of drain select lines,
each of the plurality of memory strings includes at least one of the plurality of drain select transistors, a plurality of memory cells, and at least one of a plurality of source select transistors,
the plurality of drain select lines are connected to gates of the plurality of drain select transistors, respectively,
the plurality of word lines are connected to gates of the plurality of memory cells, respectively, and
the plurality of source select lines are connected to gates of the plurality of source select transistors, respectively.

3. The semiconductor device of claim 2, wherein the line drive circuit further drives the plurality of source select lines to the level of the pass voltage on the basis of the drive address signal.

4. The semiconductor device of claim 1, wherein:
the plurality of select transistors include a plurality of source select transistors,
the plurality of select lines include a plurality of source select lines,
each of the plurality of memory strings includes at least one of a plurality of drain select transistors, a plurality of memory cells, and at least one of the plurality of source select transistors,
a plurality of drain select lines are connected to gates of the plurality of drain select transistors, respectively,
the plurality of word lines are connected to gates of the plurality of memory cells, respectively, and
the plurality of source select lines are connected to gates of the plurality of source select transistors, respectively.

5. The semiconductor device of claim 4, wherein the line drive circuit further drives the plurality of drain select lines to the level of the pass voltage on the basis of the drive address signal.

6. The semiconductor device of claim 1, wherein, when the threshold voltage variations of the plurality of select transistors are sensed on the basis of the threshold voltage variation result provided from the page buffer group, the control circuit is further configured to determine the memory block as a bad block.

7. The semiconductor device of claim 2, wherein:
a level of the threshold verification voltage is a level corresponding to a minimum level of a threshold voltage range of the drain select transistor or the source select transistor, and
the drain select transistor or the source select transistor is turned on when a voltage exceeding the threshold verification voltage is applied to a gate of the drain select transistor or the source select transistor, and is turned off when a voltage below the threshold verification voltage is applied to the gate of the drain select transistor or the source select transistor.

8. The semiconductor device of claim 7, wherein, in a case where the threshold verification voltage is provided to gates of the plurality of select transistors and a current path is sensed in one of the bit lines, a corresponding page buffer of the plurality of page buffers generates the threshold voltage variation result including information indicating that at least one of the plurality of select transistors has deteriorated within a corresponding memory string of the memory strings.

9. An operating method of a semiconductor device, the operating method comprising:
an operation of driving, to a level of a threshold verification voltage, a plurality of select lines connected to a plurality of select transistors for which threshold voltage variations are to be checked, and driving a plurality of word lines to a level of a pass voltage;
an operation of forming, to a preset voltage level, a plurality of bit lines connected to memory strings including the plurality of select transistors; and
an operation of determining, when a current path is sensed in any one of the plurality of bit lines, that a threshold voltage of at least one of the plurality of select transistors has changed, the at least one select transistor being connected to the bit line in which the current path is sensed.

10. The operating method of claim 9, wherein:
the plurality of select transistors include a plurality of drain select transistors,
the plurality of select lines include a plurality of drain select lines,
the memory strings include the plurality of drain select transistors and a plurality of source select transistors, and
the plurality of source select transistors are connected to a plurality of source select lines, respectively.

11. The operating method of claim 10, wherein the operation of driving, to the level of the threshold verification voltage, the plurality of select lines connected to the plurality of select transistors for which the threshold voltage variations are to be checked, and driving the plurality of word lines to the level of the pass voltage further comprises:
an operation of driving the plurality of source select lines to the level of the pass voltage.

12. The operating method of claim 9, wherein:
the level of the threshold verification voltage is a level corresponding to a minimum level of a threshold voltage range of the plurality of select transistors, and
the plurality of select transistors are turned off below the level of the threshold verification voltage.

13. The operating method of claim 9, wherein:
the plurality of select transistors include a plurality of source select transistors,
the plurality of select lines include a plurality of source select lines,
the memory strings include the plurality of source select transistors and a plurality of drain select transistors, and
the plurality of drain select transistors are connected to a plurality of drain select lines, respectively.

14. The operating method of claim 13, wherein the operation of driving, to the level of the threshold verification voltage, the plurality of select lines connected to the plurality of select transistors for which the threshold voltage variations are to be checked, and driving the plurality of word lines to the level of the pass voltage further comprises:
an operation of driving the plurality of drain select lines to the level of the pass voltage.

15. The operating method of claim 14, wherein:
the level of the threshold verification voltage is a level corresponding to a minimum level of a threshold voltage range of the plurality of source select transistors, and
the plurality of source select transistors are turned off below the level of the threshold verification voltage.

16. The operating method of claim 9, further comprising an operation of determining, as a bad block, a memory block of the memory strings when current paths of a preset number or greater are sensed on corresponding bit lines of the bit lines.

17. The operating method of claim 9, further comprising an operation of verifying the threshold voltage variation of each of the select transistors when current paths of a preset number or greater are sensed on corresponding bit lines of the bit lines.

18. The operating method of claim 17, wherein the operation of verifying comprises:
   an operation of driving one select line of the plurality of select lines to the level of the threshold verification voltage;
   an operation of driving, to the level of the pass voltage, the plurality of word lines and remaining select lines of the plurality of select lines;
   an operation of sensing a threshold voltage variation of a bit line connected to a memory string including one select transistor coupled to the one select line; and
   an operation of checking whether a threshold voltage variation is detected on the one select transistor.

19. The operating method of claim 18, further comprising an operation of programming the one select transistor when the threshold voltage variation is detected on the one select transistor.

20. A semiconductor device comprising:
   a memory block including memory strings each having memory cells and a select transistor coupled to a column line and respective row lines; and
   a control unit configured to:
      drive a selected row line of the row lines to a threshold voltage level of the select transistors while driving remaining row lines of the row lines to a pass voltage level and the column lines to a preset level, the selected row line being coupled to the select transistors,
      detect, when sensing one or more current paths on the column lines, a threshold voltage variation on the select transistor within a selected memory string of the memory strings, and
      program the select transistor within the selected memory string.

\* \* \* \* \*